United States Patent [19]

Wang et al.

[11] Patent Number: 5,160,492
[45] Date of Patent: Nov. 3, 1992

[54] BURIED ISOLATION USING ION IMPLANTATION AND SUBSEQUENT EPITAXIAL GROWTH

[75] Inventors: Shih-Yuan Wang, Palo Alto; Michael Renne Ty Tan, Mountain View, both of Calif.

[73] Assignee: Hewlett-Packard Company, Palo Alto, Calif.

[21] Appl. No.: 342,771

[22] Filed: Apr. 24, 1989

[51] Int. Cl.$^5$ .......................................... H01L 21/265
[52] U.S. Cl. ........................................ 437/22; 437/24; 437/26; 437/35; 437/38; 437/129
[58] Field of Search .................. 437/129, 24, 22, 23, 437/26, 35, 38, 90

[56] References Cited

U.S. PATENT DOCUMENTS

| | | | |
|---|---|---|---|
| 4,466,178 | 8/1984 | Soclof | 437/35 |
| 4,469,528 | 9/1984 | Berth et al. | 437/24 |
| 4,474,623 | 10/1984 | Adlerstein | 437/24 |
| 4,523,961 | 6/1985 | Hartman et al. | 437/130 |
| 4,648,940 | 3/1987 | Menigaux et al. | 437/129 |
| 4,737,960 | 4/1988 | Tsang | 372/45 |
| 4,845,044 | 7/1989 | Artyoshi et al. | 437/126 |
| 4,871,690 | 10/1989 | Halonyak, Jr. et al. | 437/24 |
| 4,883,771 | 11/1989 | Kumabe et al. | 437/129 |
| 4,888,624 | 12/1989 | Johnston et al. | 437/129 |
| 4,928,285 | 5/1990 | Kushibe et al. | 372/45 |
| 4,929,571 | 5/1990 | Omura et al. | 437/129 |
| 4,966,863 | 10/1990 | Mizuochi et al. | 437/129 |

FOREIGN PATENT DOCUMENTS

| | | | |
|---|---|---|---|
| 2517119 | 5/9183 | France | 437/22 |
| 57-139946 | 8/1982 | Japan | 437/24 |
| 58-199537 | 11/1983 | Japan | 437/24 |
| 8904096 | 12/1983 | Japan | 437/24 |
| 59-54221 | 3/1984 | Japan | 437/24 |
| 59-94411 | 5/1984 | Japan | 437/24 |
| 1-67935 | 3/1989 | Japan | 437/24 |

OTHER PUBLICATIONS

Muench, W., "Producing Semiconductors by Oriented Lateral Overgrowth", IBM Tech. Disc. Bull., vol. 10, No. 10, 3168.
Brady, F. T., "C-U and C-T Analysis of Buried Oxide Layers Formal by High Done Oxygen Ion Implantation", Journal of Electronic Materials, vol. 18, No. 3 1989.
Jastrzebski, L., "The Effect of 1300°-1380° C. Anneal Temperatures and Material Contamination On The Characteristics of CMOS/STMOX Devices", IEEE Electron Device Letters, vol. 9, No. 3, 1988.
Joseph M. Blum et al., "Oxygen-Implanted Double-Heterojunction Ga/As/GaAlAs Injection Laser", IEEE Journal of Quantum Electronics, vol. QE-11, No. 7, Jul. 1975, pp. 413-418.
D. P. Wilt et al., "Channeled substrate buried heterostructure InGaAsP/InP laser employing a buried Fe ion implant for current confinement", Appl. Phys. Lett. 44(3), Feb. 1, 1984, pp. 290-292.
S. M. Sze, *VLSI Technology*, McGraw-Hill Book Company, pp. 68-71, 1985.
J. P. van der Ziel, et al., "Single Longitudinal Mode Operation of Er-Doped 1.5 μm InGaAaP Lasers", Applied Physics Letter 50(19), May 11, 1987, p. 1313.
W. T. Tsange et al., "Observation of Enhanced Single Longitudinal Mode Operation in 1.5 μm GaInAsP Erbium-doped Semiconductor Injection Lasers", Applied Physics Letter 49(25), Dec. 22, 1986, p. 1686.
Fulin Xiong, et al. "High Efficiency Single Quantum Well Graded-Index Separate-Confinement Heterostructure Lasers Fabricated With MeV Oxygen Ion Implantation"; Appl. Phys. Lett. 54 (8) Feb. 10, 1989 pp. 730-732.
E. Kapon, et al. "Patterned Quantum Well Semiconductor Injection Laser Grown By Molecular Beam Epitaxy"; Appl. Phys. Lett. 52 (8), Feb. 22, 1988; pp. 607-609.

Primary Examiner—Olik Chaudhuri
Assistant Examiner—G. Fourson

[57] ABSTRACT

A method of producing a buried insulation layer used to channel current through a small opening through the insulation layer. Ions are implanted to a depth controlled by the ion kinetic energy and are activated to form the insulation layer. A groove, preferably V-shaped is formed to produce through the insulation layer in opening through which current is to be channeled. Epitaxial layers are formed on the grooved surface to produce an integrated circuit that channels current through this opening.

11 Claims, 8 Drawing Sheets

BURIED ISOLATION USING ION IMPLANTATION AND SUBSEQUENT EPITAXIAL GROWTH

BACKGROUND OF THE INVENTION

In the Figures, the same element presented in different figures will have the same reference numeral. The first digit of a reference numeral will indicate the first figure in which that reference numeral is utilized.

This invention relates in general to buried isolation layers and relates more particularly to such layers in GaAs devices. In a variety of applications, it has been found advantageous to produce insulating or semiinsulating regions to produce lateral confinement of certain currents. For example, in the quantum well semiconductor injection laser structure of FIG. 1 (see E. Kapon et al, "Patterned quantum well semiconductor injection laser grown by molecular beam epitaxy", Appl. Phys. Lett. 52(8), Feb. 22, 1988), after the laser structure 11 has been produced, lateral current confinement is obtained by bombarding regions 12 and 13 with protons. These high energy protons produce a semiinsulating region by damaging the lattice in the implanted region. Unfortunately, this method produces a current confinement region 14 more than 2 microns, which is wider than desired and therefore does not provide as strong confinement as can be achieved with this invention.

In the graded index separate-confinement heterostructure (GRINSCH) AlGaAs/GaAs laser of FIGS. 2A and 2B (see Fujin Xiong, et al "High efficiency single quantum well graded-index separate-confinement heterostructure lasers fabricated with MeV oxygen ion implantation", Appl. Phys. Lett. 54(8), Feb. 20, 1989), after fabrication of the laser structure, a gold mask 21 is used during a step (shown in FIG. 2A) of implanting O+ ions to produce a pair of oxygen doped regions 22 and 23. When an n-type substrate is used, after annealing this structure, a pair of semiinsulating regions 24 and 25 are produced to provide lateral confinement of current through active region 26 of the laser. Unfortunately, this conductive region bounded by insulating regions 24 and 25 is also wider than desired.

SUMMARY OF THE INVENTION

In lasers, light within a laser cavity induces emission of photons from certain excited atomic or molecular states within the cavity, thereby amplifying the intensity of light in the cavity. Since the amount of induced emission is proportional to the intensity of light in the cavity, it is advantageous to confine the light to a small region (known as the graded index separate confinement heterostructure (GRINSCH) region) to produce a large intensity of light within that region. Within the GRINSCH region is an active region within which stimulated emission of light takes place. In many solid state lasers, the active region of the laser is sandwiched between a pair of adjacent wider bandgap regions of decreased index of refraction to confine both the laser light and the electrical current to the active region of the laser.

The amount of induced emission is also proportional to the number of atoms that are in excited states that can be induced by this light to emit photons. In current pumped lasers, the current excites electrons and holes into excited states that include the states from which the laser light emission can be induced. In order to improve the efficiency of the laser as a function of current, it is important to channel substantially all of the pumping current through the active region of the laser so that the electrons that are excited by this current can be induced to emit. This requires the formation of a narrow conductive channel that passes through the active region of the laser. In the Kapon reference discussed above, the current region is wider than the active region and so is less efficient than desired in producing electron hole pairs in the active region of the laser. In the Xiong reference, the current is fairly well confined to the active region of the laser, but this active region is wide enough that it will not produce a single lateral optical mode. Devices other than lasers can also benefit from lateral confinement to a very narrow conductive channel.

In accordance with the illustrated preferred embodiments, a high energy beam of ions is injected into a substrate and the substrate is processed to form a buried insulating layer. Alternately, several ion beams of different energies can be used to implant ions. A groove is also formed into the surface of the wafer to a depth that extends through the buried insulating layer. Epitaxial deposition is then utilized to form device structures on top of this grooved substrate. Because the groove extends through the insulating layer, this epitaxial deposition produces a conductive channel that extends through the insulating layer.

In the preferred embodiment, the buried insulating layer is formed and then the groove is formed into the substrate through the buried insulating layer. Although the groove can have a cross-section of any shape, the groove preferably is V-shaped so that the width of the channel can be controlled by controlling the depth of the V-shaped groove. This enables production, through the bottom of the insulating layer of an opening that is much smaller than the minimum lithographic line width. The width $W_1$ of the channel depends on the ion implantation depth and the depth and shape of the V-groove.

In an alternate embodiment, the groove is formed into the substrate and then a pair of ion beams are directed at angles relative to the substrate normal such that a buried layer is formed that is intersected by the groove. These angles are selected to determine the width of the subsequently produced conductive channel that extends through this insulating layer. Since the contour of the resulting insulating layer roughly follows the contour of the V-groove, this alternate embodiment has the advantage that deeper V-grooves can be utilized for a given implant energy.

DESCRIPTION OF THE PREFERRED EMBODIMENT

Figure 3A:
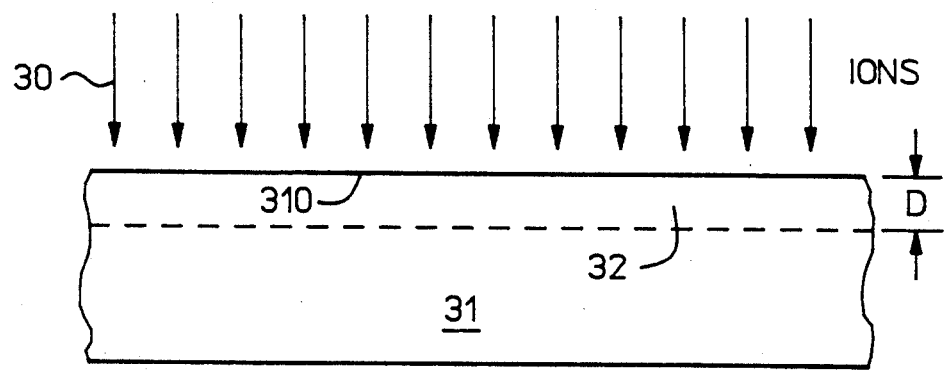
FIGS. 3A–3C illustrate the preferred embodiment of the invention wherein a V-shaped groove is formed in the substrate after the buried insulating layer is formed.
Figure 3B:
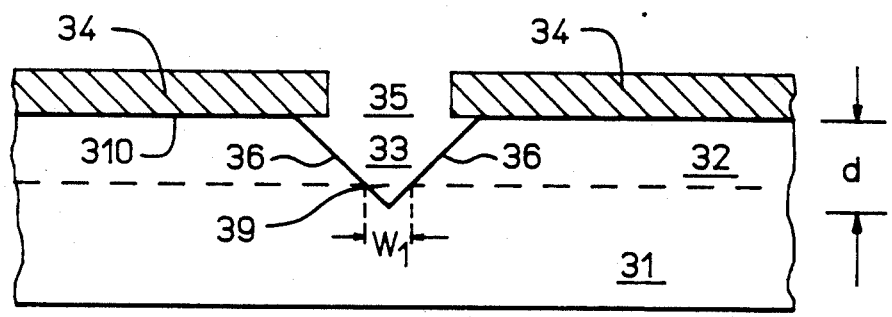
Figure 3C:
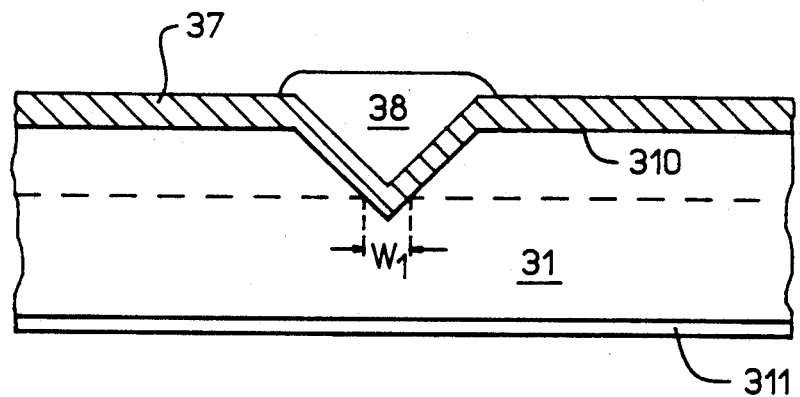

In FIGS. 3A-3C is illustrated the preferred embodiment of a method of providing lateral confinement of current in integrated devices such as certain classes of solid state lasers and bipolar transistors. A beam 30 of ions is implanted in a wafer 31 to a depth D that is controlled by the kinetic energy of the incident beam of ions. These ions are activated to form an insulating layer 32 of depth D that extends from the top surface 310 of the substrate to the dashed line in FIGS. 3A-3C. This insulating layer typically has a resistivity of at least $10^7$–$10^9$ Ω-cm.

By any convenient technique, such as chemical etching in conjunction with standard photolithographic technique illustrated in FIGS. 3B-3C, a groove is formed into substrate 31. This groove can have any cross-sectional shape, but preferably is V-shaped as illustrated by groove 33 of FIGS. 3B and 3C. In the photolithographic processes illustrated in these two figures, a mask 34 having an opening 35 is formed on top of substrate 31 to control partially the lateral width of the groove. Etchants and substrate lattice orientation are selected to produce a V-shaped groove 33. If the duration of etching is reduced somewhat, the groove will have a truncated V-shaped cross-section in which the tip of the V has been truncated. As long as the groove extends through the the bottom of insulating region 32, this truncation will not qualitatively change the operation of the resulting device. In general, herein, a V-shaped groove is one in which the size of the opening formed by the groove through the bottom of the insulating layer is a decreasing function of the depth of the bottom of this layer. This enables the size of the opening through the bottom of the insulating layer to be varied by controlling the relative depth of the bottom of this groove and the depth of the bottom of the insulating layer.

Figure 4A:
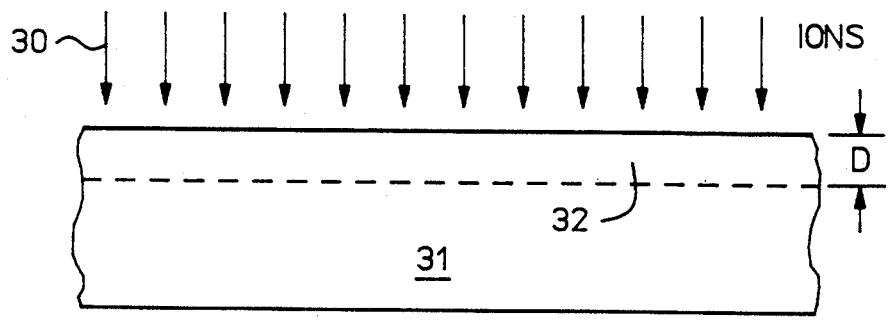
FIGS. 4A–4C illustrate the preferred embodiment of the invention wherein a rectangular groove is formed in the substrate after the buried insulating layer is formed.
Figure 4B:
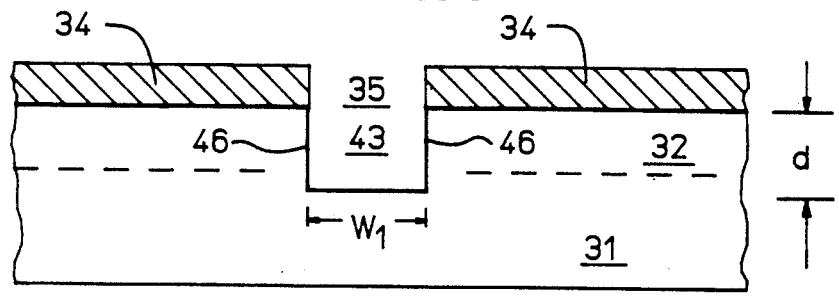
Figure 4C:
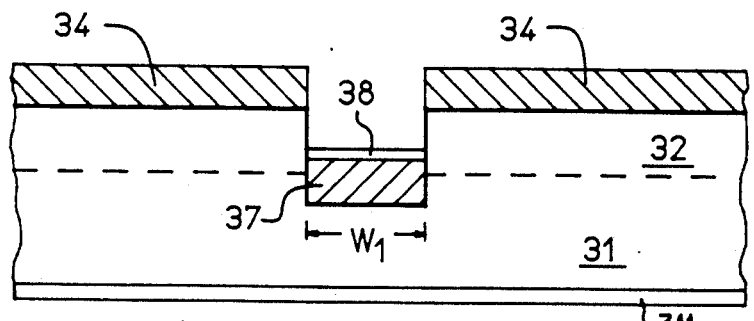

In FIGS. 4A-4C are illustrated a process equivalent to that of FIGS. 3A-3C except that the groove has a rectangular cross-section. That is, through opening 35 of mask 34 is etched a groove 43 having substantially vertical sidewalls 46. This groove is etched into wafer 31 to a depth that penetrates completely through insulating layer 32. Because the sidewalls are substantially vertical, this groove has a width $W_2$ substantially equal to the width of the opening 35 through mask 34. Reactive ion etching processes are known that can produce such a groove.

The V-shaped groove of FIG. 3C is advantageous in that the width $W_1$ of the groove at the bottom of the insulating layer is determined not only by the width of opening 35, but is also controlled by the depth d of the groove. Thus, for the V-shaped groove, the width $W_1$ of the opening 39 at the bottom of insulating layer 32 is not limited by the minimum lateral dimensions of opening 35 through mask 34, but instead can be reduced substantially below the width of opening 35. As will be illustrated below, this enables the current to be channeled through a very narrow conductive channel, thereby improving the efficiency of many integrated devices that can be fabricated using this process.

In FIGS. 3C and 4C, mask 34 is removed and epitaxial semiconducting layers 37 unique for a particular device are formed on the wafer. Electrical contacts 38 and 311 are then formed on this structure.

Figure 5:
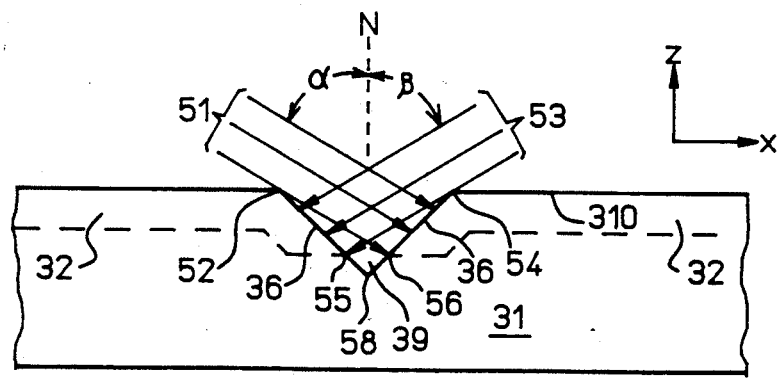
FIG. 5 illustrates an alternate embodiment of the invention in which the buried insulating layer is formed after the groove is formed in the surface of the wafer.

In the embodiment of FIG. 5, the buried insulating layer 32 is formed after groove 33 is formed. Instead of utilizing an ion beam normal to the surface of the wafer as in FIGS. 3A and 4A, a pair of ion beams 51 and 53 are utilized that form an angle $\alpha$ and $\beta$, respectively, with the normal N to top surface 310 of the substrate. Angle $\alpha$ is selected such that corner 52 of groove 33 acts as a shadow mask to shadow the bottom of the groove from exposure to ion beam 51. Angle $\beta$ is selected such that corner 54 of groove 33 acts as a shadow mask to shadow the bottom of the groove from exposure to ion beam 53. This results in the portion of wall 36 of groove 33 being unexposed by the ion beams. After activation of these ions, an insulating layer 32 is formed through which the tip 58 of groove 33 extends, thereby leaving in the region of tip 58 an opening 39 that will form through insulating layer 32 a conductive path after epitaxial semiconducting layers are grown on top of this grooved substrate.

Typically, activation of the ions involves a high temperature annealing step that converts the ion implanted layer into an insulating layer.

These processes have particular application to n-doped GaAs substrates 31 (see the Xiong reference discussed above). For this particular case, singly or doubly ionized oxygen atoms are utilized as the implanted ions. Doubly ionized oxygen atoms are preferred because, for a given implant kinetic energy, such ions require half the accelerating potential required for singly ionized oxygen atoms. After implanting these ions, the substrate is annealed at 850° C. for 2 seconds in Argon atmosphere to activate these ions. By activate is meant that, after activation, the layer of implanted ions functions as an insulating layer. Because As can outgas from a GaAs substrate at this temperature, a capping layer, such as a layer of $SiO_2$ is deposited on the substrate before the step of annealing. Steps to apply and remove such a capping layer are well known. This capping layer is removed after this annealing step.

Figure 1:
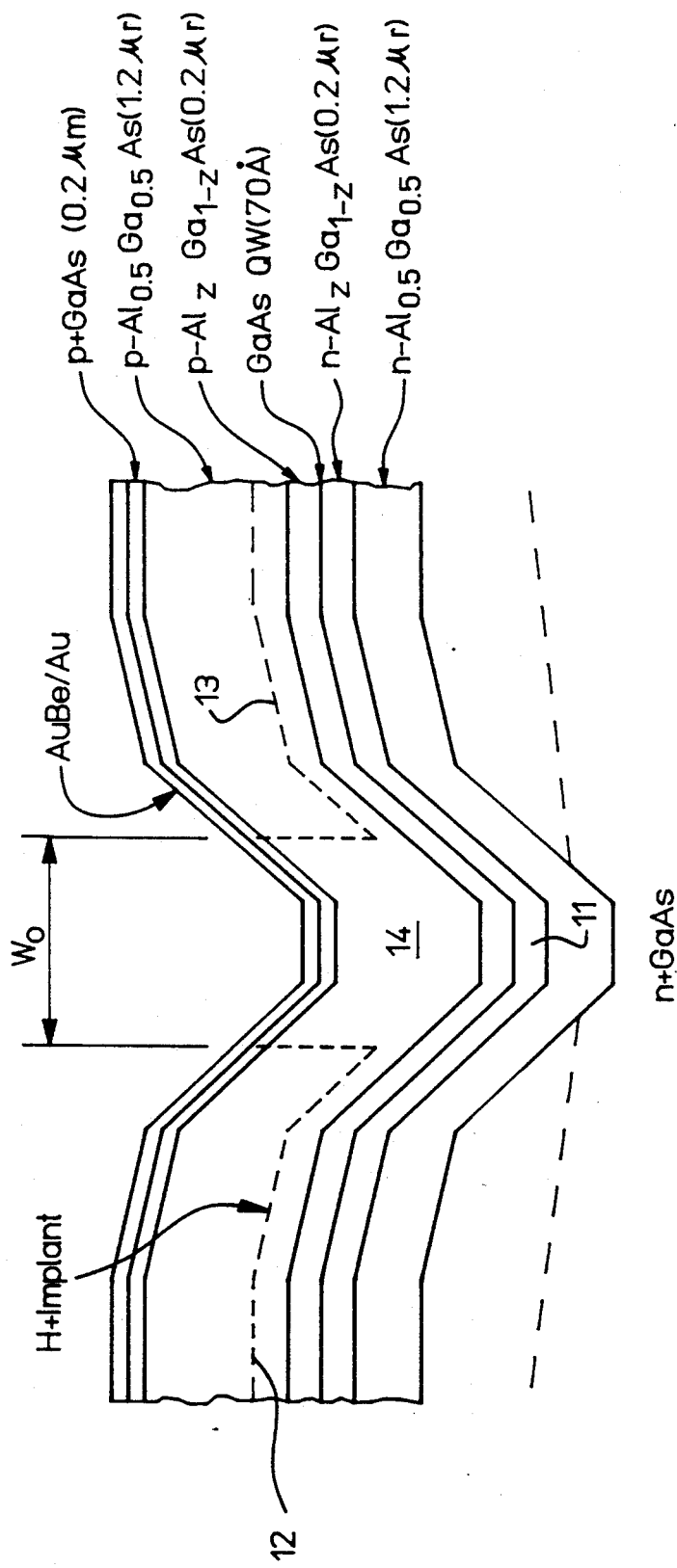
FIG. 1 shows a prior art nonplanar solid state laser that utilizes proton implantation to form semiinsulating regions that provide lateral current confinement.
Figures 2A, 2B:
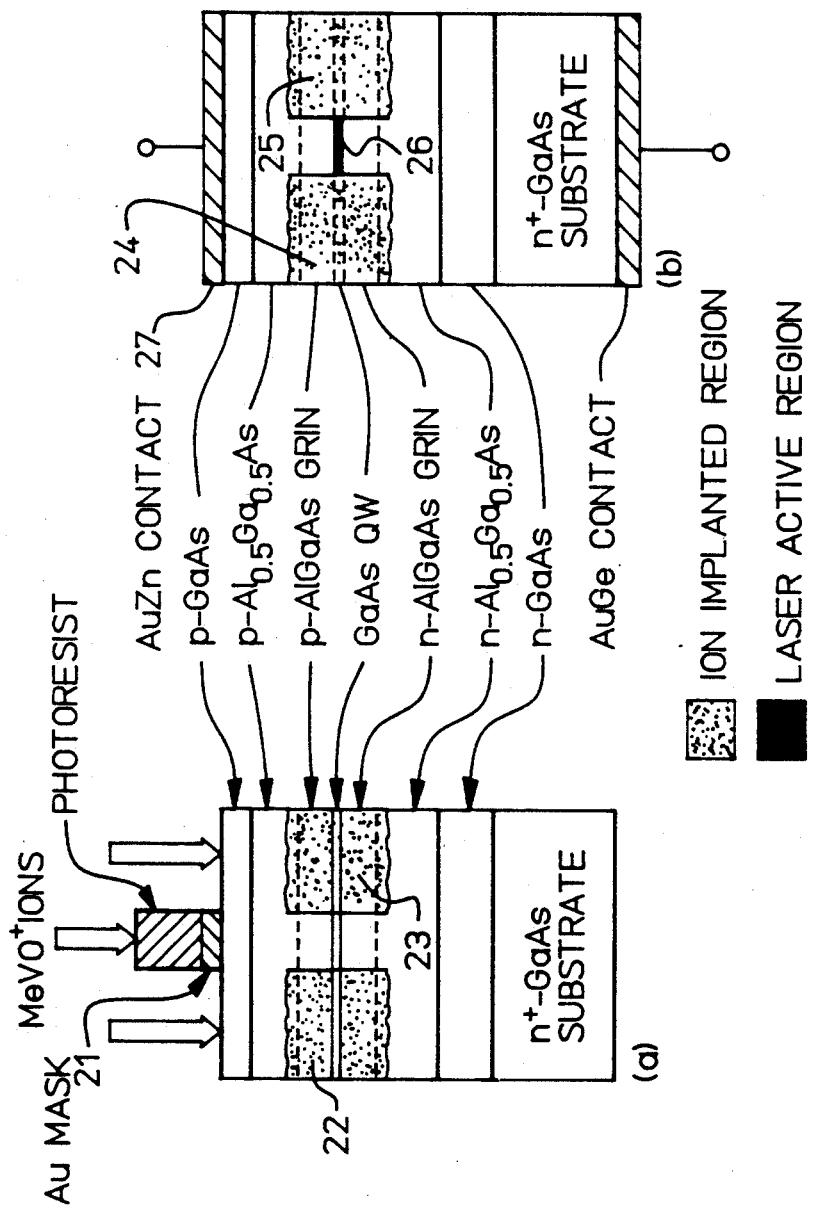
FIGS. 2A and 2B illustrate a prior art method of providing lateral current confinement in a planar graded index separate-confinement heterostructure laser by the implantation of oxygen atoms after formation of the laser structure.
Figure 6:
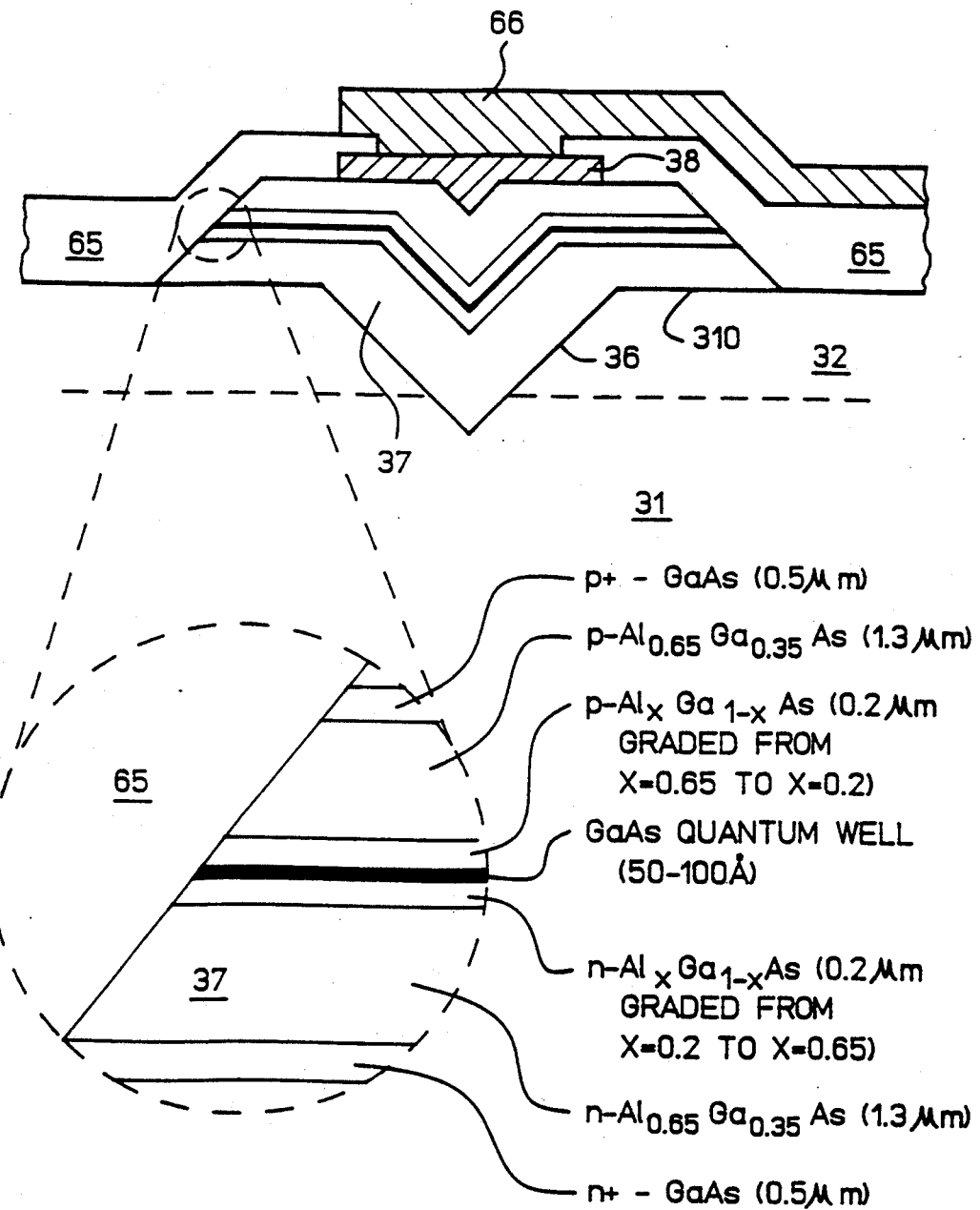
FIG. 6 shows a laser manufactured in accordance with the method illustrated in FIGS. 3A-3C and 4A-4C.
Figure 8:
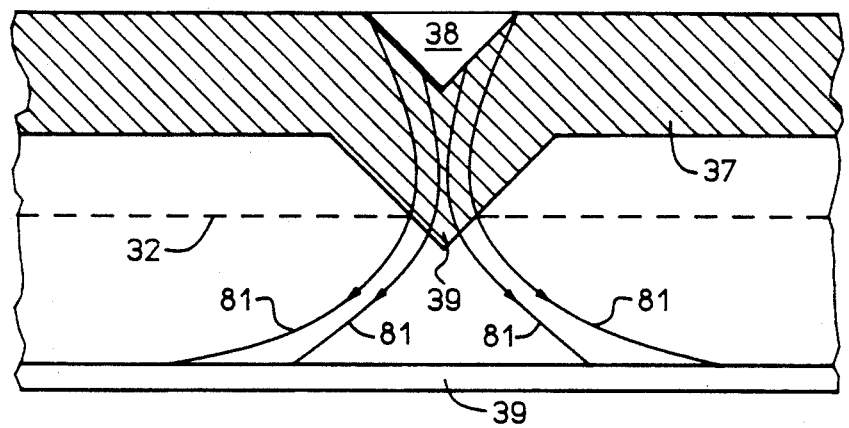
FIG. 8 illustrates the current flow through the opening in the bottom of the insulating layer.

This general process of lateral confinement can be more clearly understood by reference to the particular embodiments of FIGS. 6 and 8. In FIG. 6 is a quantum well semiconductor injection laser similar to that in FIG. 1, except that lateral isolation is produced by the process discussed above instead of by proton isolation as discussed in the reference by E. Kapon discussed in the Background of the Invention in conjunction with FIG. 1. Therefore, this laser includes an insulating layer 32 that laterally confines the current to a narrow conductive channel that directs a high density of current through the active region of the laser.

Figure 7A:
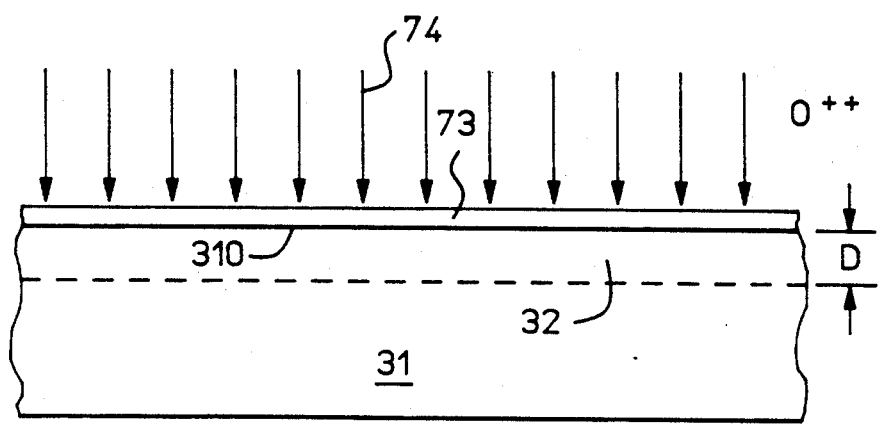
FIGS. 7A and 7B illustrates steps in the fabrication of the laser of FIG. 6.
Figure 7B:
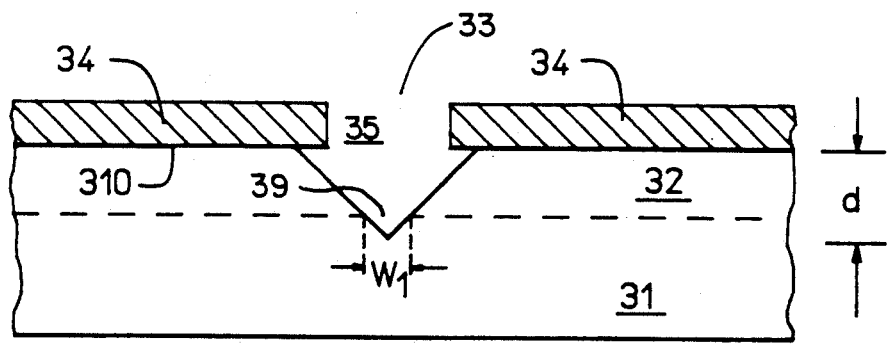

In FIGS. 7A-7B are presented the steps of manufacturing the device of FIG. 6. A (100) oriented n+ doped GaAs substrate 31 is immersed in a strong etch (consisting of ammonium hydroxide, hydrogen peroxide and water) to remove polishing damage to a top surface 310 of this wafer. This wafer is then rinsed in deionized (DI) water.

It appears that any n-type dopant can be used in substrate 31, but this dopant is preferably selected to be silicon. Substrates doped with silicon in a concentration of $10^{18}$ are available from commercial sources such as Sumitomo.

A protective layer 73 of $SiO_2$ is deposited onto surface 310 to protect the wafer. A beam 74 of doubly ionized 380 keV oxygen ions implants $2 \cdot 10^{15}/cm^2$ $O^{++}$ ions in substrate 31 to a depth of about 0.9 microns. To avoid channeling, this beam is directed along a direction that is at a 7° tilt from normal to layer 73 and 30° away from the wafer flat that indicates the (110) plane. Singly ionized ions could be used, but these would require twice the accelerating voltage as required for doubly ionized oxygen ions, which can be accelerated to this energy by readily available commercial ion implanters.

To activate these implanted ions to form an insulating layer 32, this wafer is rapidly heated in Argon at 850° C. for 2 seconds. Protective layer 73 protects the substrate from contamination by secondary or sputtered ions that are produced by the ion implanter and also prevents arsenic from outgasing during this annealing step. Protective layer 73 is now removed by immersing it in buffered hydrofluoric acid and then rinsing in deionized water.

A positive resist is applied by a clear field mask exposure to produce a patterned resist layer for use in a lift-off process. Over this patterned photoresist is evaporated 1000 Å of $SiO_2$. The wafer is then immersed in acetone to lift off those portions of this $SiO_2$ layer that overlay portions of the patterned resist. This produces a $SiO_2$ mask 34 having pattern that includes at least one 2 μm wide opening 35 as shown in FIG. 7B. This pattern is oriented such that a groove of V-shaped cross-section will be produced in the wafer. The wafer is now immersed in either a solution containing ammonium hydroxide, deionized water and hydrogen peroxide or a solution containing surfuric acid, deionized water and hydrogen peroxide to etch a V-groove 33 having a depth d of about 2 μm. The duration of this step controls the depth of the V-groove and therefore also controls the width $W_1$ of the opening 39 though insulating layer 32.

Mask 34 is removed by immersing the wafer in a buffered HF solution for 10-20 seconds and then rinsing in deionized water.

By use of well known epitaxial processes, such as organo-metallic vapor phase epitaxy (OMVPE) process, molecular beam epitaxy (MBE), liquid phase expitaxy (LPE), or chemical beam expitaxy (CBE), epitaxial layers are grown on grooved substrate 31 to produce the laser structure of FIG. 6. The depth d of groove 33 and the thicknesses of the epitaxial layers 62 are chosen to position the active region 63 of the laser about 0.2 microns above the bottom of insulating layer 32.

The efficiency of the laser is strongly dependent on the location of this active region relative to the conductive opening 39 through insulating layer 32. Fig. 8 illustrates the importance of the positioning of the active region 63 relative to opening 39 at the bottom of insulating layer 32. Current flow lines 81 illustrate the density of current from electrode 38 to electrode 311 through opening 39 in insulating layer 32. This figure illustrates that the current density is greatest at opening 39, has a slightly reduced density for a short distance above opening 39, but decreases sharply almost immediately below opening 39. Therefore, it is important to center the active region 63 at a point that is substantially at or slightly above opening 39. Because the actual location of the center of the active region will vary somewhat due to manufacturing tolerances, it is advisable to select a design that, in the ideal manufactured product, centers the active region slightly above (i.e., on the order of 0.2 microns above) opening 39 vertically and centered over opening 39 laterally.

A contact mask is now formed on the wafer, the wafer is dipped in a solution of ammonium hydroxide, dionized water and hydrogen peroxide and then rinsed in DI water to clean the exposed p+ GaAs surface. Approximately 100 Å of NiCr is evaporated onto the wafer and then about 2000 Å of AuZn is deposited. The wafer is dipped in acetone to lift off the contact mask and then the wafer is heated in nitrogen to 460° C. for 5 minutes to form a p-contact.

Device to device isolation can be achieved by numerous means including proton isolation and etching. In accordance with the latter of these choices, a mask is deposited over the laser circuit and the wafer is immersed into a strong etch consisting of ammonium hydroxide, deionized water and hydrogen peroxide to etch the substrate in the lateral exposed regions down to original top surface 310.

A polyimide layer 65 has a contact opening to expose a portion of p-contact electrode 38 and otherwise covers the rest of the semiconductor surfaces. This polyimide layer is 1-2 μm thick and is defined photolithographically.

In order to thicken the metal contact, a contact mask is formed on the wafer, the wafer is cleaned as before and then 100 Å of NiCr followed by 3000 Å of Au are deposited on the wafer. The wafer is dipped into acetone to again lift off the contact mask, thereby producing electrode bonding connect metal 66 that is in contact with p-contact 38 and also resides on top of polyimide layer 65.

The wafer (which initially is approximately 20 mils thick) is now backlapped to thin it down to 4 mils to simplify cleaving of laser facets. The back surface is prepared for the n-contact by immersing the wafer in a solution of ammonium hydroxide, deionized water and hydrogen peroxide to remove about 5 microns of the wafer to eliminate the lapping damage to the wafer. On the backside of the wafer are now deposited 100 Å of NiCr followed by 2500 Å of AuGe. The wafer is then heated in nitrogen to 460° C. for 5 minutes to form the n-contact. On top of this contact are deposited 100 Å of NiCr and then 3000 Å of Au to form electrode 311. The wafer is then scribed and cleaved to separate the individual laser devices and form the end facets of the lasers.

Figure 9:
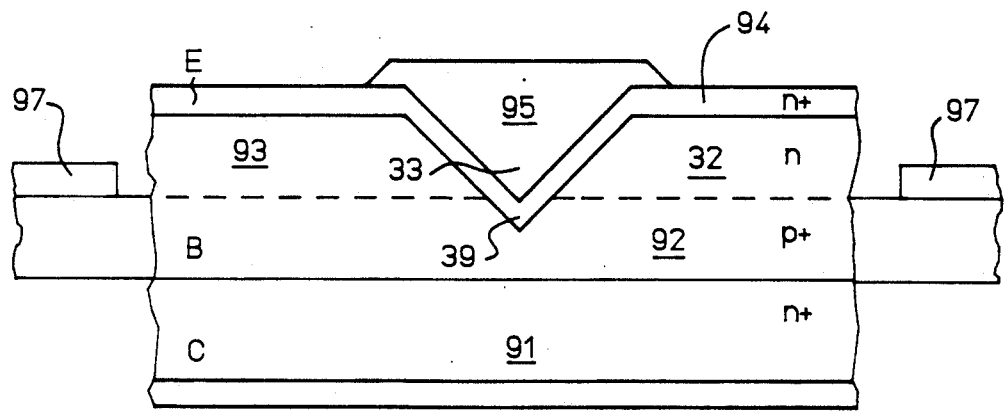
FIG. 9 shows a bipolar transistor manufactured in accordance with the method illustrated in FIGS. 3A-3C and 4A-4C.

Devices other than lasers can also benefit from a buried isolation layer. For example, in FIG. 9 is presented a bipolar transistor manufactured in accordance with the above-discussed process. On a n-type substrate 91 are sequentially grown a p-type layer 92 and an n-type layer 93. In accordance with the process of FIGS. 3A-3C or FIG. 5, a V-shaped groove 33 and a buried insulating layer 32 are formed. On top of layer 93 is produced an n-type layer 94 and then metal contacts 95, 96 and 97 are produced. Layers 91, 92 and 94 respectively function as the collector C, the base B and the emitter E of a bipolar transistor.

The current from emitter 94 to base 92 is restricted to opening 39 so that the effective emitter area is limited to the portion of emitter 94 that projects through opening 39. This results in a very small emitter area and therefore significantly reduces the emitter-base capacitance of this transistor. Implanted ions used in the production of the insulating layer 32 can penetrate into base region 92 without degrading operation of this transistor. As taught in Xiong (discussed in the Background of the Invention), such oxygen ions do not have any effect in a p-doped region.

In other related embodiments, instead of forming a groove 33 as in FIG. 5, a more general type of pattern is formed into the substrate, extending in at least one region through insulating layer 32 to form at least one opening 39 through the bottom of insulating layer 32. For example, a mask having a substantially square opening therethrough can be used to etch a pyramidal shaped indentation into the substrate. Such an indentation has the advantage of narrowing in both the x and y directions as a function of depth z within the indentation. For such an indentation, opening 39 formed by this indentation through the bottom of insulating layer 32 can be made small in both the x and y directions by selecting the depth of this indentation to be slightly greater than the depth of the bottom of the insulating layer 32.

Figure 11:
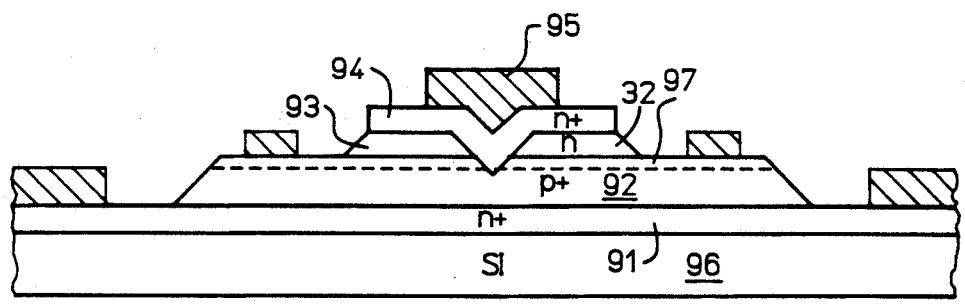
FIG. 11 illustrates an embodiment in which the insulating layer is formed in a conductive layer formed on a nonconductive substrate.
Figure 10A:
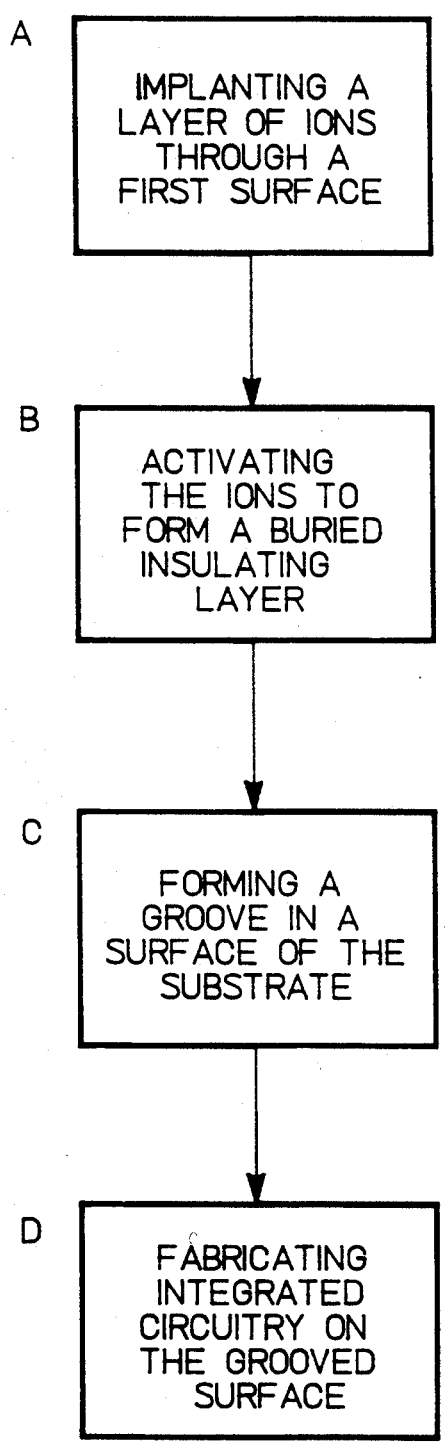
FIGS. 10A and 10B are flow diagrams for the process steps illustrated in FIGS. 3 and 4.
Figure 10B:
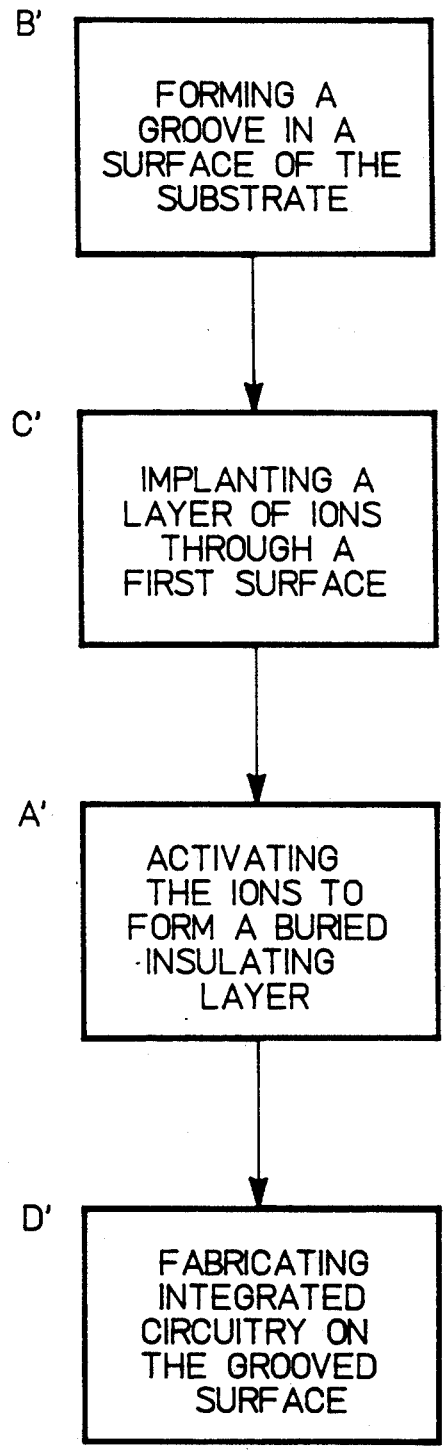

Also, in other embodiments of this invention, such as that in FIG. 11, a buried insulating layer can be formed in a conductive epitaxial layer previously formed on a semiinsulating substrate 96 or in a conductive layer produced by ion implantation. In such embodiments, an epitaxial layers 91-93 are formed on the semiinsulating substrate and then are processed by steps like described above to form the transistor shown in FIG. 11. In this particular embodiment, the ions are embedded to a depth indicated by dashed line 98. These implanted O+ or O++ ions can extend into the p+ layer 92 because, as above-indicated, they produce an insulating region only in n-type material.

We claim:

1. A method of fabricating a semiconductor device, the method comprising:
    implanting oxygen ions into a gallium arsenide wafer adjacent a surface thereof;
    annealing to activate the ions and thereby form a buried insulating layer adjacent the surface; and
    after annealing, epitaxially growing a plurality of semiconductor layers on said surface to form a semiconductor device above the buried insulating layer.

2. A method as in claim 1 wherein the ions are doubly ionized.

3. A method of fabricating a semiconductor device, the method comprising:
    implanting oxygen ions into a gallium arsenide wafer adjacent a surface thereof;
    annealing to activate the ions and thereby form a buried insulating layer adjacent the surface;
    after annealing, etching a groove through the insulating layer to provide an opening from the surface through the insulating layer to a conductive portion of the wafer; and
    epitaxially growing a plurality of semiconductor layers in and over the groove to form a semiconductor device above said insulating layer.

4. A method as in claim 3 wherein the ions are doubly ionized.

5. A method as in claim 3 wherein the semiconductor device comprises a laser.

6. A method as in claim 5 wherein an active region of the laser is located in the groove.

7. A method of fabricating a semiconductor device, the method comprising:
    etching a groove into a surface of a gallium arsenide wafer, a corner being defined along a boundary between the surface and a first side of the groove;
    directing a stream of oxygen ions onto the surface of the wafer at an acute angle with respect to the surface and across the groove such that the corner masks a portion of a second side of the groove opposite the first side, thereby implanting the ions into the wafer adjacent the surface and adjacent the unmasked portion of the second side of the groove;
    annealing to activate the ions and thereby form a buried insulating layer adjacent the surface and the unmasked portion of the second side of the groove; and
    after annealing epitaxially growing a plurality of semiconductor layers in and over the groove to form a semiconductor device above said buried insulating layer.

8. A method as claim 7 and further comprising, after the etching step and before the annealing step, directing a stream of oxygen ions onto the surface to the wafer at an acute angle with respect to the surface and across the groove such that a corner defined along a boundary between the surface and the second side of the groove masks a portion of the first side of the groove, thereby implanting the ions into the wafer adjacent the unmasked portion of the first side of the groove.

9. A method according to claim 7 wherein the ions are doubly ionized.

10. A method according to claim 7 wherein the semiconductor device comprises a laser.

11. A method according to claim 10 wherein an active region of the laser is located in the groove.

* * * * *